(12) United States Patent
Perlov et al.

(10) Patent No.: US 6,813,182 B2
(45) Date of Patent: Nov. 2, 2004

(54) DIODE-AND-FUSE MEMORY ELEMENTS FOR A WRITE-ONCE MEMORY COMPRISING AN ANISOTROPIC SEMICONDUCTOR SHEET

(75) Inventors: Craig M Perlov, San Mateo, CA (US); Stephen Forrest, Princeton, NJ (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 10/160,802

(22) Filed: May 31, 2002

(65) Prior Publication Data

US 2003/0223270 A1 Dec. 4, 2003

(51) Int. Cl.[7] .............................................. G11C 11/36
(52) U.S. Cl. ...................... 365/175; 365/105; 365/243
(58) Field of Search ........................... 365/175, 96, 105, 365/115, 173, 243

(56) References Cited

U.S. PATENT DOCUMENTS

| | | | | |
|---|---|---|---|---|
| 3,909,805 A | * | 9/1975 | Touron et al. ............... | 365/105 |
| 4,494,135 A | * | 1/1985 | Moussie ....................... | 257/50 |
| 4,569,120 A | * | 2/1986 | Stacy et al. .................. | 438/467 |
| 4,597,162 A | | 7/1986 | Johnson et al. | |
| 6,385,075 B1 | * | 5/2002 | Taussig et al. ............... | 365/105 |
| 6,545,898 B1 | * | 4/2003 | Scheuerlein .................. | 365/94 |
| 6,567,295 B2 | * | 5/2003 | Taussig et al. ............... | 365/105 |

FOREIGN PATENT DOCUMENTS

EP  1265287 A2  12/2002

* cited by examiner

*Primary Examiner*—Gene Auduong

(57) ABSTRACT

A donor/acceptor-organic-junction sheet employed within an electronic memory array of a cross-point diode memory. The donor/acceptor-organic-junction sheet is anistropic with respect to flow of electrical current and is physically unstable above a threshold current. Thus, the volume of the donor/acceptor-organic-junction sheet between a row line and column line at a two-dimensional memory array grid point serves both as the diode component and as the fuse component of a diode-and-fuse memory element and is electrically insulated from similar volumes of the donor/acceptor-organic-junction sheet between neighboring grid point intersections.

12 Claims, 8 Drawing Sheets

DIODE-AND-FUSE MEMORY ELEMENTS FOR A WRITE-ONCE MEMORY COMPRISING AN ANISOTROPIC SEMICONDUCTOR SHEET

TECHNICAL FIELD

The present invention relates to memory devices and, in particular, to cross-point diode memory devices in which an anisotropic semiconductor sheet is employed as a two-dimensional array of fuse-and-diode memory elements.

BACKGROUND OF THE INVENTION

As computer processors and digital data storage devices have become more and more commonly used in consumer electronics, the need for high-capacity, but inexpensive, digital storage devices has greatly increased. In some cases, the lack of sufficiently inexpensive, high-capacity digital memory devices has inhibited marketing of new consumer electronics devices that store large amounts of digital data during operation. An example of consumer electronics devices that need inexpensive, high-capacity digital memory is high-resolution digital cameras. Although increasing in popularity, digital cameras are currently still too expensive for wide popular acceptability. Moreover, digital cameras can be manufactured with much greater resolution, but the digital data storage requirements for the higher-resolution images captured by these higher-resolution digital cameras further increase their operating cost.

Digital data is commonly stored on rotating magnetic disk drives and in semiconductor-based memories, such as EEPROMS and flash memories. Disk drives are expensive, consume rather large amounts of power, and are insufficiently robust for many consumer devices. Flash memories are more robust but, because they are produced by the photolithographic techniques used to produce microprocessors and other semiconductor electronic devices, they are currently too expensive for use in inexpensive consumer electronic devices, or for write-once consumer applications, such as storing digital images captured with digital cameras.

Recently, a new cross-point diode memory has been developed to serve as a high-capacity, write-once memory in consumer electronics devices, such as digital cameras. FIG. 1 is a cut-away isometric view of a portion of a cross-point diode memory module. The cross-point diode memory module comprises a number of identical, stacked layers. Layers 101–113 are shown in FIG. 1. Each layer comprises a substrate 116 on which a two-dimensional memory array 118 is formed. The two-dimensional memory array comprises row and column conductive elements, or lines, that together create a grid-like pattern. The row lines of the two-dimensional memory array are electronically coupled to input/output ("I/O") leads 120–123 via a row multiplexer/demultiplexer circuit 124. The column lines are coupled to column I/O leads 126–129 via a column multiplexer/demultiplexer circuit 130. The row I/O leads 120–123 and the column I/O leads 126–129 are electronically connected with contact elements, such as contact element 132 to which row I/O lead 120 is connected, that extend along the sides of the cross-point diode memory module to electronically interconnect the row I/O leads and column I/O leads of all layers 101–113 of the memory module. Each grid point intersection of a row line and column line in the two-dimensional memory array 118 represents a single binary storage element. Note that, as will be discussed below, the row lines do not physically contact column lines at grid-point intersections, but are coupled through a memory element. Each memory element can be electronically accessed for reading or writing by producing appropriate electronic currents in the contact elements, such as contact element 132.

FIG. 2 illustrates a single memory element of a two-dimensional memory array from a layer of a cross-point diode memory device. In FIG. 2, a portion of a row line 202 is shown orthogonal to, and above, a portion of a column line 204. As discussed above, the intersection of the row line 202 and column line 204 corresponds to a single bit of stored digital information. In a cross-point diode memory, intersecting row and column lines, such as row 202 and column 204 in FIG. 2, are electrically coupled through a memory element 206. In electrical terms, the memory element comprises a fuse 208 and a diode 210 in series.

Digital binary digits, or bits, can have one of two possible values, "0" and "1." Physical media that store digital data in digital memory devices generally have two different physical states that can be interconverted and that can be detected via a physical signal. In the case of a cross-point diode memory element, such as memory element 206 in FIG. 2, one of the two binary states is represented by an intact fuse 208, and the other of the two binary states is represented by a blown fuse 208. Unlike a read/write memory, such as a hard disk drive, a cross-point memory element can be converted from the fuse-intact state to the fuse-blown state only once, and hence cross-point diode memories are generally write-once memories. The diode 210 component of the memory element 206 serves to eliminate undesirable electrical paths between row and column lines. When the fuse component 208 of a memory element 206 is intact, the electrical resistance of the memory element 206 is relatively low, and currents can pass between the row line 202 and column line 204. In order to change the state of the memory element from the fuse-intact state to the fuse-blown state, a much higher current is passed through the memory element 206 between the row line 202 and the column line 204, resulting in electrical failure of the fuse component 208. Once the fuse component 208 has failed, the electrical resistance of the memory element 206 is relatively high, and comparatively little or no current can pass from the row line 202 through memory element 206 to the column line 204. Thus, a memory element of the cross-point diode memory can be written, or changed from the fuse-intact state to fuse-blown state via a high current signal, and the state of the memory element can be determined by determining whether the memory element passes a comparatively low current signal.

The cross-point diode memory module illustrated in FIGS. 1 and 2 may serve as a high-capacity, but inexpensive digital data storage component of consumer electronics devices provided that an inexpensive and efficient technique can be found for manufacturing the fuse-and-diode memory elements, such as fuse-and-diode memory element 206 illustrated in FIG. 2. Thus, designers and manufacturers, consumer electronic devices requiring inexpensive, high-capacity digital data storage components have recognized the need for a inexpensive and efficient method for manufacturing cross-point diode memory elements.

SUMMARY OF THE INVENTION

One embodiment of the present invention provides a thin sheet of anisotropic semiconductor material that can be sandwiched between row and column lines of a two-dimensional memory array of a cross-point diode memory layer. The anisotropic semiconductor material is composed of small-molecule organic compounds that can be formed in stable films, one on top of the other, or laminated together, to produce a donor/acceptor-organic-junction device. A donor/acceptor-organic-junction device is, by its nature, a diode. The films can be manufactured to have relatively low electrical resistivity in a direction perpendicular to the plane of the films and to have relatively high electrical resistivity in the plane of the film, and are thus anisotropic. Because the semiconductor sheet is anisitropic with respect to electrical resistivity, the memory elements do not need to be manufactured by expensive photolithographic techniques or otherwise manufactured to correspond to the row line and column line dimensions and orientations, but instead arise in the anisotropic donor/acceptor-organic-junction material via proximity to memory-array grid points.

The anisotropic semiconductor sheet passes current in one direction between intersecting row and column lines of a two-dimensional memory array. When a high-voltage or high-current signal passes between a column line and a row line, the small-molecule compounds forming the anisotropic seiconductor sheet vaporize, leaving a gap in the anisotropic semiconductor sheet at the intersection of the row line and column line through which the high-current or high-voltage signal is passed. Once a gap has been formed, a relatively low-current signal can no longer pass between the column line and row line, and hence the anisotropic semiconductor sheet serves as the fuse component of a cross-point diode memory element. The anisotropic semicondcutor sheet composed of films of small-molecule organic compounds thus serve as an array of fuse-and-diode memory element at each grid point of the two-dimensional memory array of a cross-point diode memory device.

DETAILED DESCRIPTION OF THE INVENTION

One embodiment of the present invention provides a sheet-like, anisotropic, semiconductor material comprising small-molecule organic compounds that is placed between the row lines and column lines of a two-dimensional cross-point diode memory array to serve as fuse-and-diode memory elements for each grid point of the array. The anisotropic semiconductor material comprises two layers composed of different small-molecule organic compounds formed or laminated together to provide a donor/acceptor-organic-junction device. The donor/acceptor-organic-junction represented by the interface between the two, chemically distinct layers produces the diode functionality of the memory elements, and the easily vaporized, small-molecule organic compounds that compose the films provide the fuse functionality of the memory elements. Because the semiconductor sheet is anisotropic, and because electrical current does not generally flow in the plane of the semiconductor sheet, a single anisotropic semiconductor sheet can be sandwiched between the row and column lines of a memory-array grid to provide all the memory elements for the memory-array grid.

A molecule comprises atoms bonded together via covalent bonds, generally bonding molecular orbitals inhabited by electrons shared between two or more atoms within the molecule. The electrons of a molecule occupy molecular orbitals with discrete energy levels, or, in other words, occupy quantized energy-level states, or quantum states. In a solid, molecular orbitals of adjacent molecules within the solid may combine to produce delocalized orbitals that allow electrons inhabiting the delocalized molecular orbitals within the solid to move relatively freely through the solid. This mobility allows electrons occupying delocalized orbitals to carry an electric current through the solid.

Figure 3:
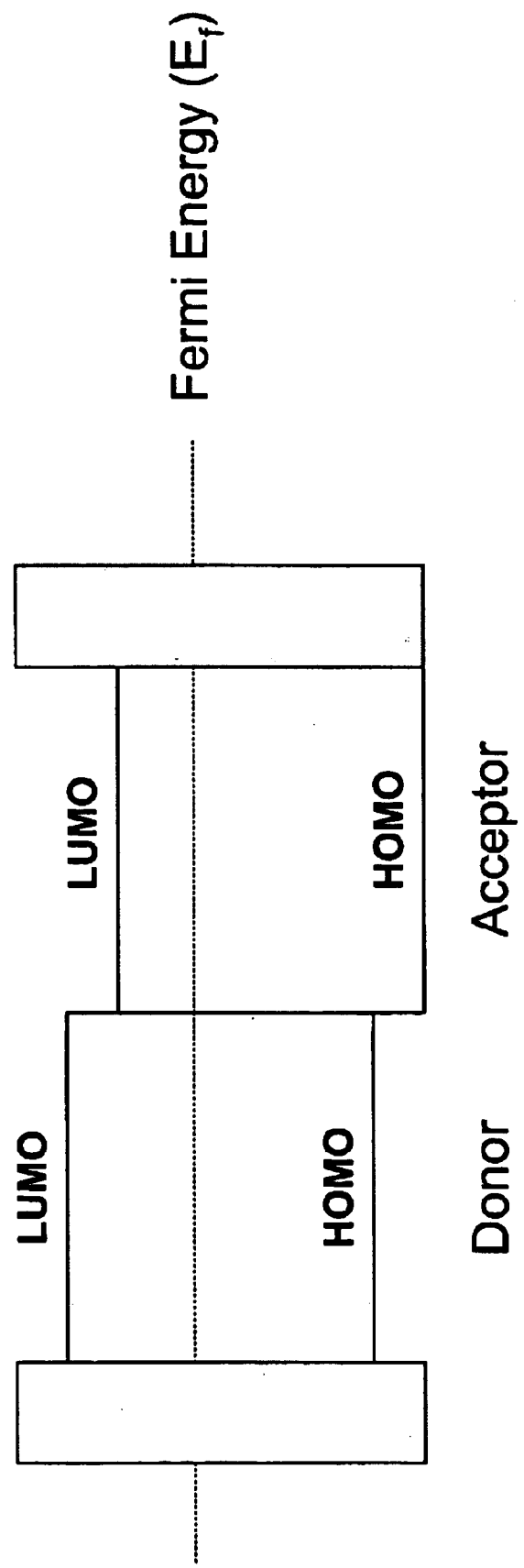
FIGS. 3–5 illustrates donor/acceptoror-ganic-junction devices.
Figure 4:
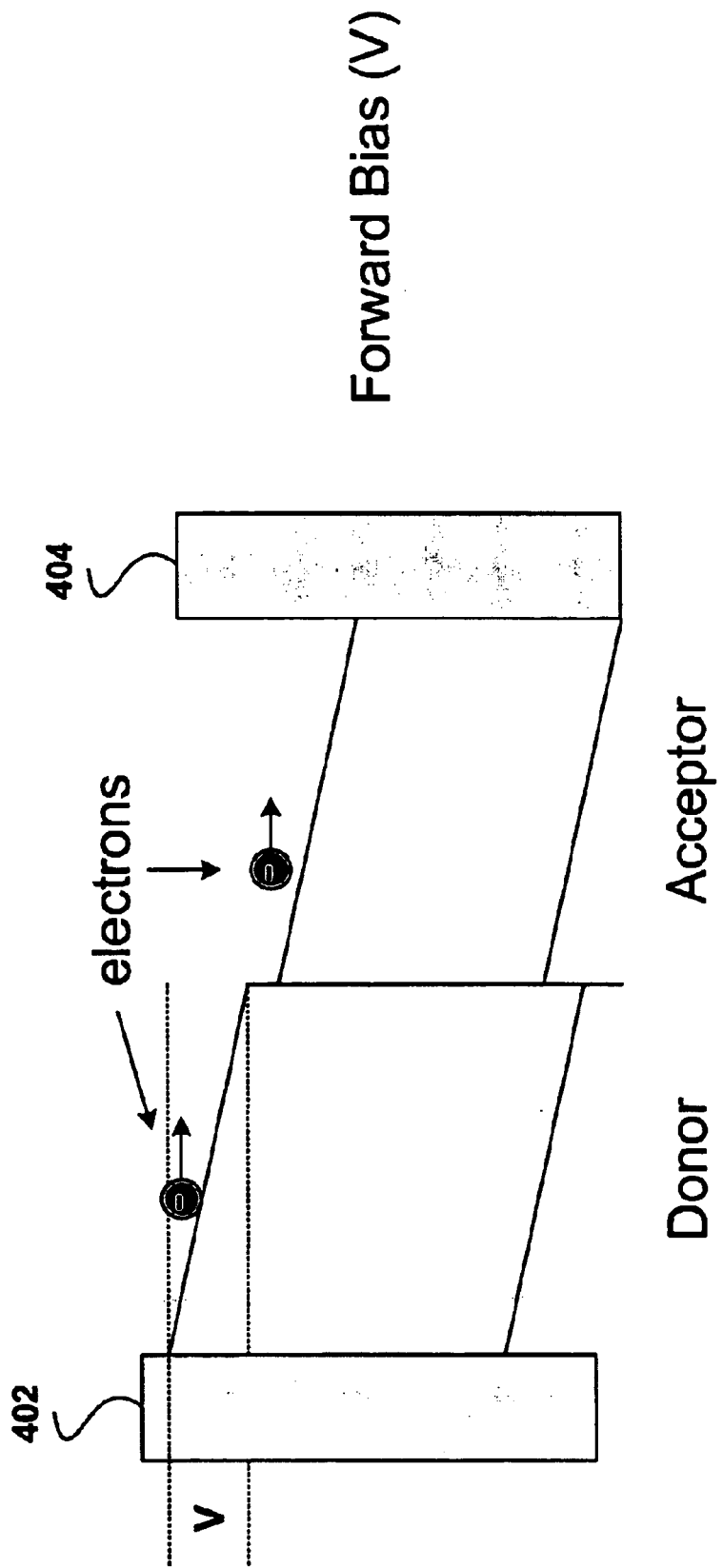

The operation of an organic diode can be explained by the behavior of the molecular orbital electron energy levels. The Highest energy Occupied Molecular Orbital at zero temperature is denoted HOMO and the Lowest energy Unoccupied Molecular Orbital is denoted LUMO. A donor-acceptor junction of two organic materials can be represented by the energy diagram shown in FIG. 3. The donor material can be copper phthalocyanine ("CuPc") and the acceptor material can be 3,4,9,10-perylenetetra-carboxylic-bis-benzimidazole ("PTCBI"). Under bias, the energy levels tilt, as shown in FIGS. 3 and 4. In FIG. 4 the junction is in forward bias. Electrons are injected from the cathode 402 into the LUMO of the donor and thence into the LUMO of the acceptor and complete the electrical circuit to the anode 404.

Figure 5:
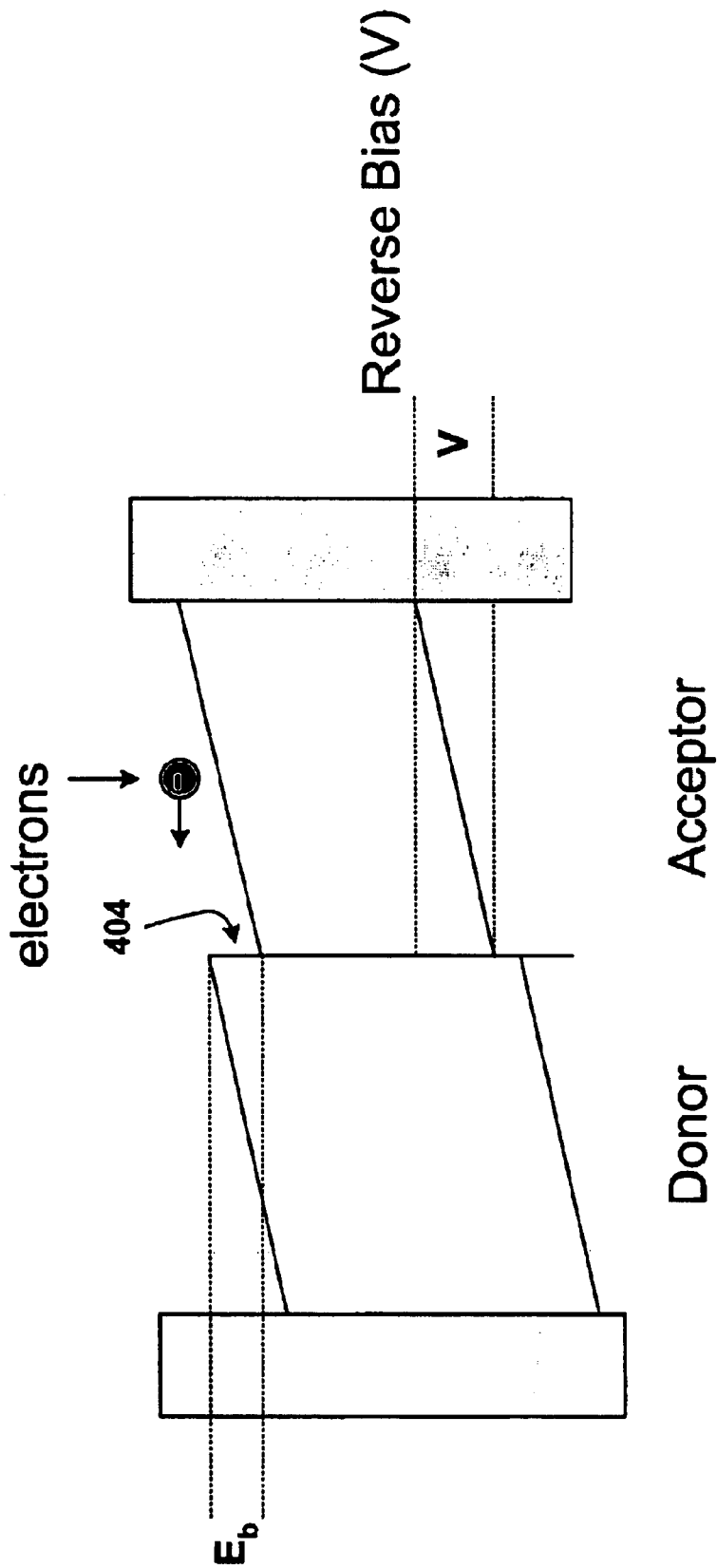

FIG. 5 shows a junction in reverse bias. Here the electrons are injected into the LUMO of the acceptor, but are blocked from entering the LUMO of the donor by energy barrier $E_b$ 502. Thus this donor-acceptor junction is acting like a diode, freely passing current under forward bias and blocking current in reverse bias.

A fuse is a simple electrical device used to protect electrical circuits from excess current flow. A fuse is inserted into a circuit so that, when current flow exceeds some threshold value, the fuse fails, breaking the circuit and preventing current flow above the threshold value within the circuit. Prior to the advent of circuit breaker panels, simple screw-in fuses were common in household circuitry. These household fuses screwed into a socket and directed current through a thin metallic strip visible through a clear window on the top of the fuse. When the current in the household circuitry exceeded a threshold value, the metal foil would be incinerated, breaking the circuit, and protecting internal household circuitry from damage.

Figure 1:
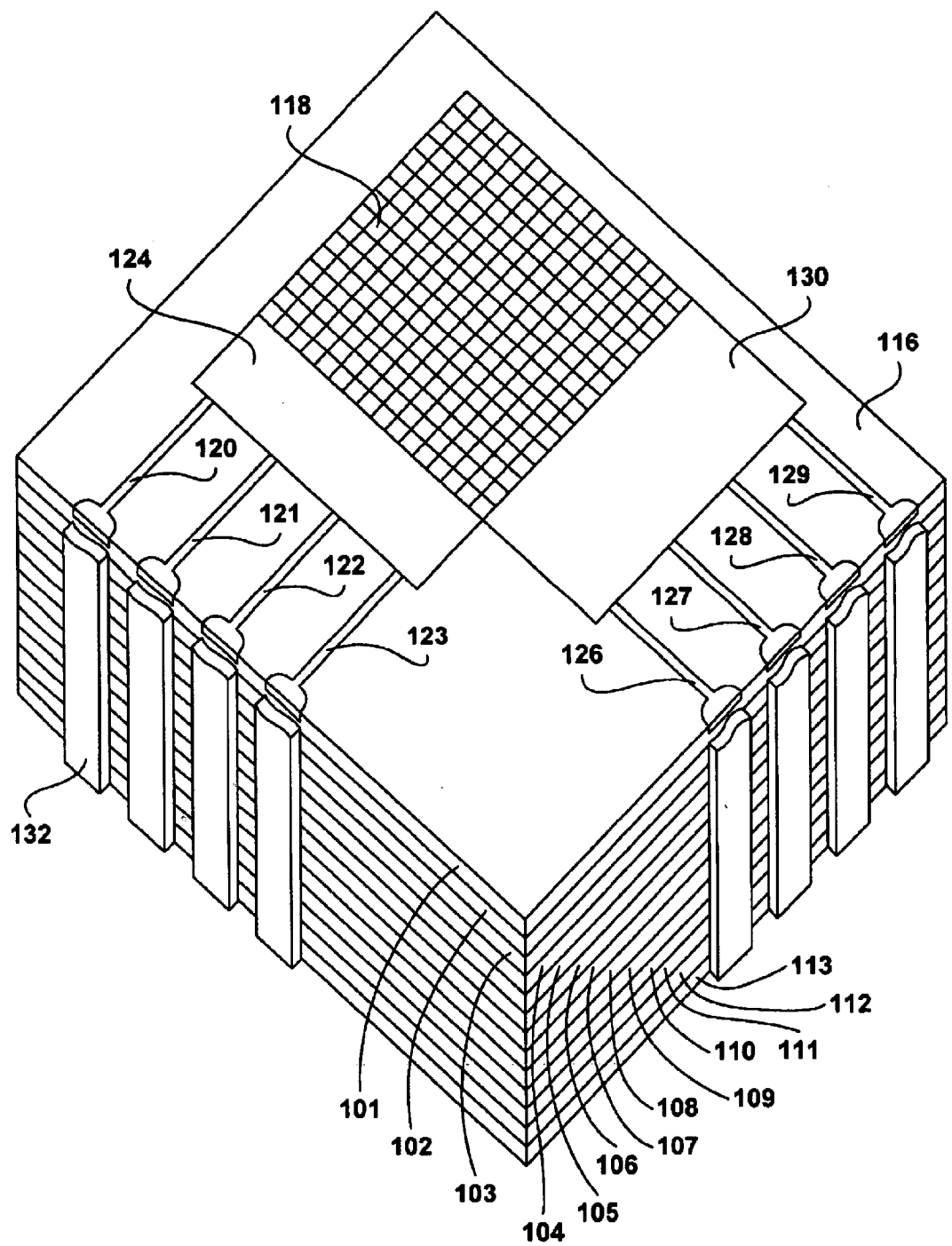
FIG. 1 is a cut-away isometric view of a portion of a cross-point diode memory module.
Figure 2:
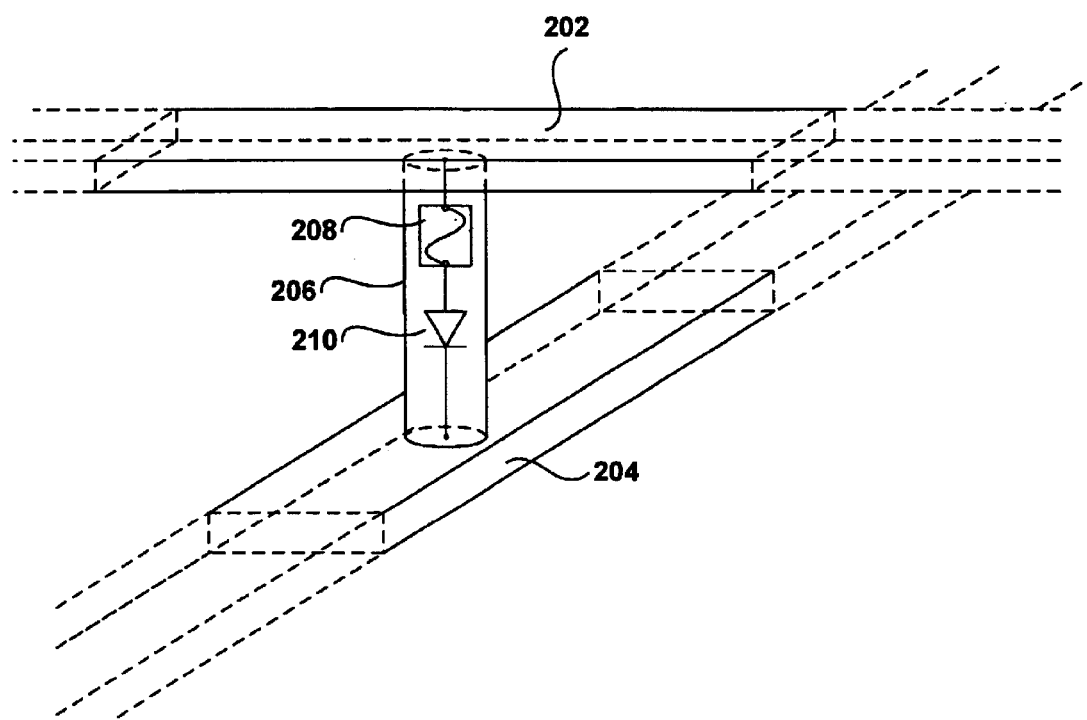
FIG. 2 illustrates a single memory element of a two-dimensional memory array from a layer of a cross-point diode memory.

It would be possible to fashion the two-dimensional memory array illustrated in FIGS. 1 and 2 from silicon-based semiconductor materials via a photolithographic process, in the same fashion that complex circuitry within microchips is manufactured. By this process, diode-and-fuse memory elements can be laid down between the row and column lines at each grid point of the array. Unfortunately, photolithographic processes, while economical for microprocessors and RAM memories that are generally used over and over again in high-end computers and electronic devices, are much too expensive for write-once consumer applications, such as storing digital pictures within digital cameras analogously to storing analog pictures on photographic film.

Figure 6:
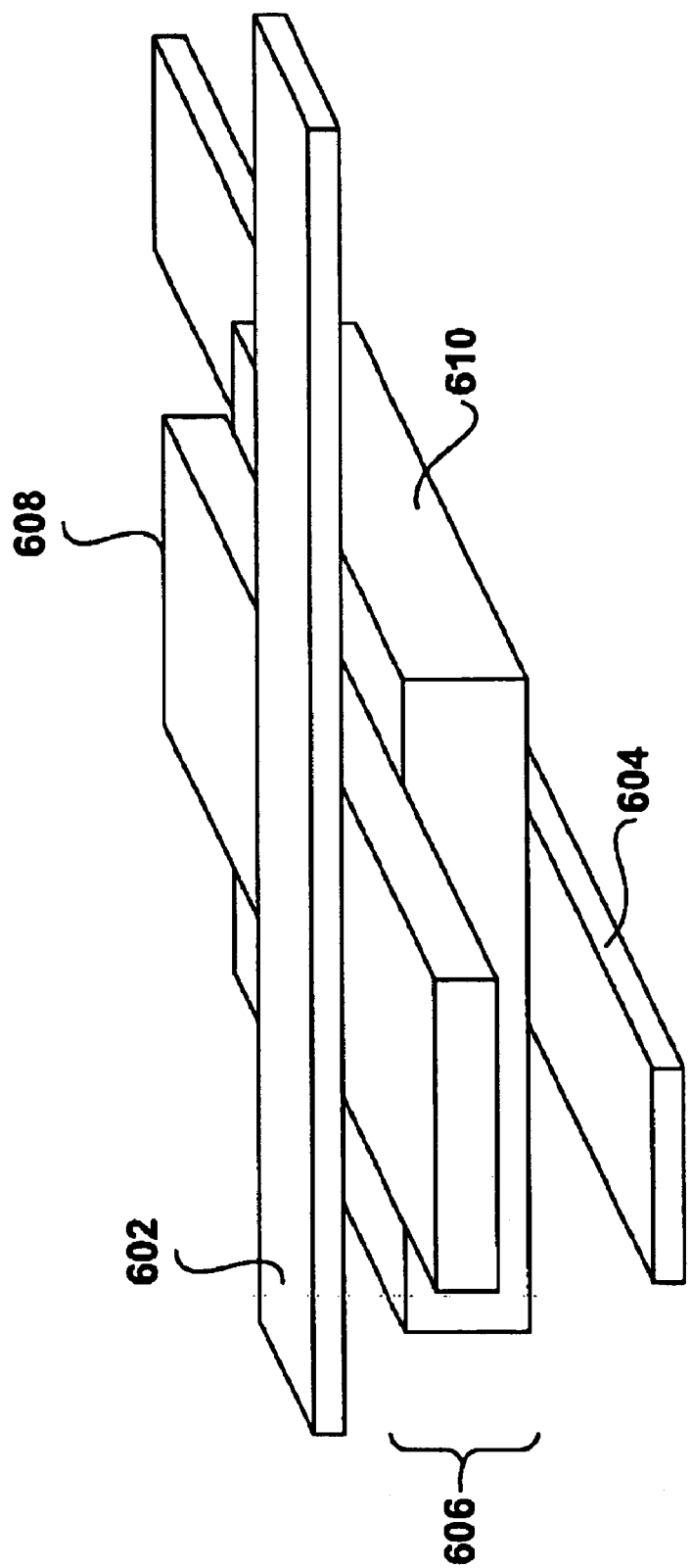
FIG. 6 illustrates a single memory element representing one embodiment of the present invention.

The present invention arose from a recognition that a continuous sheet of anisotropic, donor/acceptor-organic material can serve as the memory elements for an entire two-dimensional memory array of a layer of a cross-point diode memory without the need for expensive micromanufacturing. FIG. 6 illustrates a single memory element representing one embodiment of the present invention. FIG. 6 illustrates the intersection between a row line 602 and a column line 604 within a two-dimensional memory array, as previously illustrated in FIG. 2. However, in place of a discrete, micromanufactured array element (206 in FIG. 2), the memory element constructed in accordance with one embodiment of the present invention comprises a volume of a donor/acceptor-organic-junction sheet material 606 between the row line 602 and column line 604. The organic sheet comprises a thin acceptor layer 608 formed against, or laminated to, a thin donor layer 610. In the orientation shown in FIG. 6, electrical current may pass from the column line 604 to the row line 602, but only a tiny, reverse current can pass from the row line 602 to the column line 604. Thus, the donor/acceptor-organic junction sheet 606 serves as the diode component of the memory element illustrated in FIG. 2.

Figure 7:
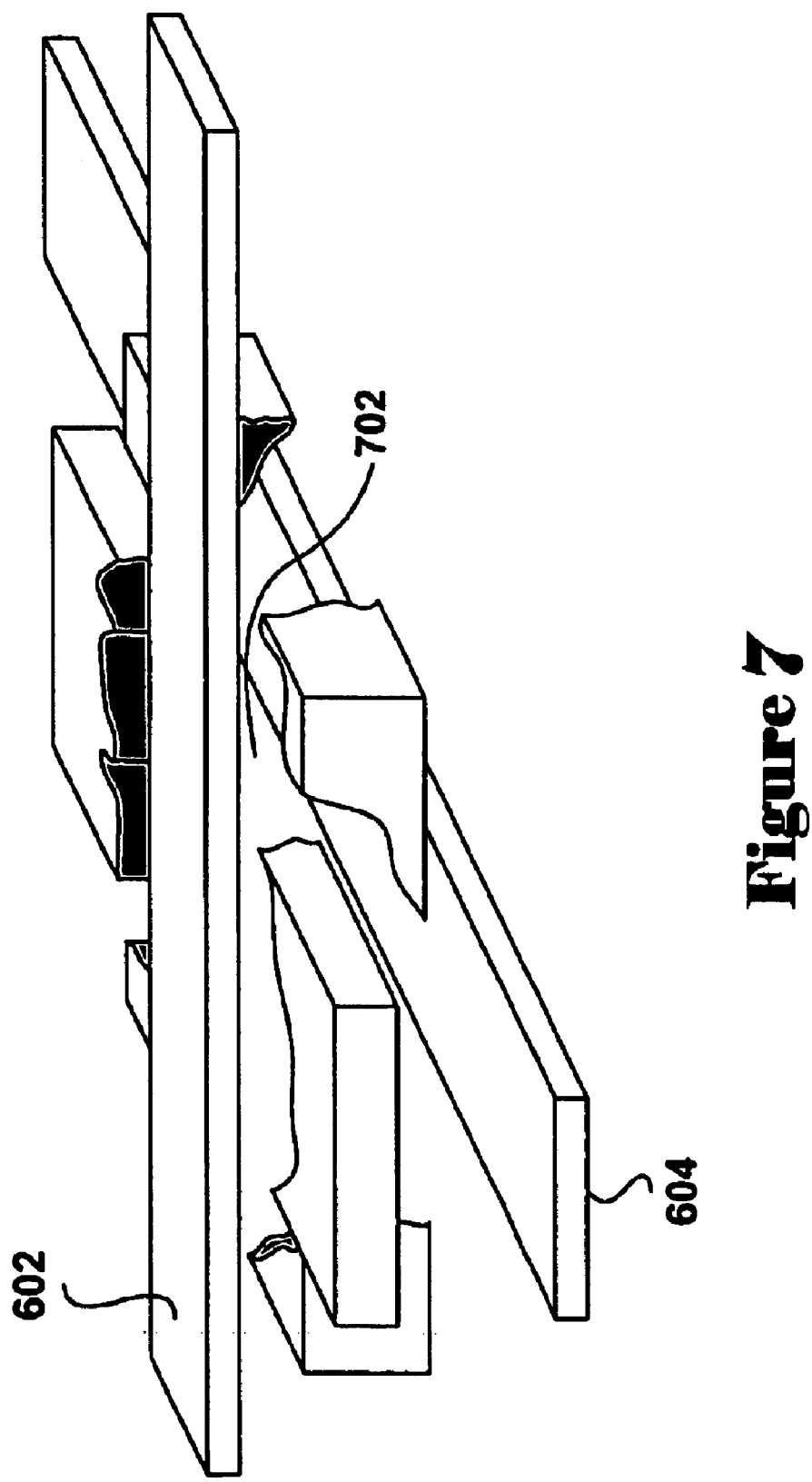
FIG. 7 illustrates the two-dimensional grid point intersection illustrated in FIG. 6 following passage of a relatively high current between the column line and the row line.

Because the donor/acceptor-organic-junction sheet 606 is physically unstable above a threshold current, the donor/acceptor-organic-junction sheet also serves as the fuse component of the memory element illustrated in FIG. 2. FIG. 7 illustrates the two-dimensional grid point intersection illustrated in FIG. 6 following passage of a current exceeding the failure threshold current for the donor/acceptor-organic-junction sheet between the column line 604 and the row line 602. The higher-than-threshold current has vaporized a volume of the donor/acceptor-organic-junction sheet between and in the neighborhood of the grid-point intersection leaving an empty region, or gap 702, between the row line 602 and column line 604. The gap is filled with air, and is equivalent to insertion of a resistor between row 602 and column line 604. Alternatively, the layers of the donor/acceptor-organic-junction sheet may locally delaminate between and in the neighborhood of the grid-point intersection at high voltages, and equivalently fail to conduct electricity following delamination. Thus, FIGS. 6 and 7 illustrate the two binary states of the memory element at a two-dimensional array grid point constructed according to one embodiment of the present invention, with FIG. 6 illustrating a fuse-intact state, and FIG. 7 representing the fuse-blown state. The fuse-intact state may represent the binary value "1" and the fuse-blown state may represent the binary value "0," or, by an alternate convention, the fuse-intact state may represent the binary value "0," and the fuse-blown state may represent the binary value "1."

The additional property needed by the donor/acceptor-organic-junction sheet of one embodiment of the present invention is that it conduct current in a direction perpendicular to the plane of the sheet, but conduct little or no current in a direction parallel to the plane of the sheet. This current-carrying anisotropy provides electrically discrete memory elements at each two-dimensional memory array grid point without a need for micromanufacture of memory elements. Because current is not conducted in a direction parallel to the plane of the sheet, current cannot flow through the donor/acceptor-organic-junction sheet from an active grid point to an inactive grid point, and thus short-circuit the two-dimensional memory array. Furthermore, when a strong current is employed at a grid point to blow the memory element during a write operation, the strong current cannot travel laterally within the donor/acceptor-organic-junction sheet to blow the memory element fuse of other grid points.

Thus, a donor/acceptor-organic-junction sheet must have the following properties for the above-described use in a two-dimensional memory array: (1) a good rectification ratio, or, in other words, the donor/acceptor-organic-junction sheet should pass current with comparatively low electrical resistance in a forward direction perpendicular to the plane of the sheet but pass current with comparatively high electrical resistance in the opposite, reverse direction; (2) physical instability at voltages higher than the voltages applied during memory read operations; (3) a low electrical resistance, or high conductance, in the forward direction; and (4) a stable electrical resistance, or high conductance, in the forward direction. In addition, it is desirable for the donor/acceptor-organic-junction sheet to be easily manufactured to predetermined tolerances, relatively inexpensive, and physically stable at voltages below and equal to the voltages applied during memory read operations and within a range of temperatures to which the memory device is expected to be exposed.

Figure 8A:
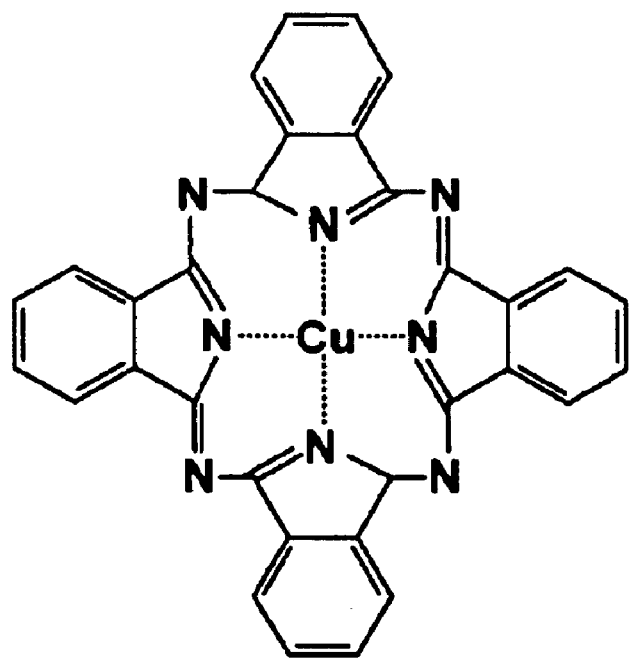
FIG. 8A shows the chemical structure of copper phthalocyanine and FIG. 8B shows the chemical structure of 3,4,9,10-perylenetracarboxylic-bis-benzimidazole.
Figure 8B:
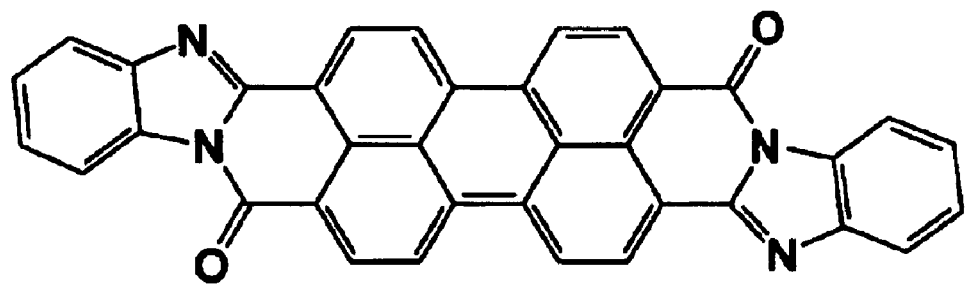

A continuous donor/acceptor-organic-junction sheet for use as the multiple memory elements of a two-dimensional memory array within a cross-point diode memory can be manufactured as a film of the donor-type material, CuPc laminated to, or formed upon, a film of the acceptor-type material PTCBI. FIG. 8A shows the chemical structure of CuPc and FIG. 8B shows the chemical structure of PTCBI. A two-layer donor/acceptor-organic-junction sheet comprising layers of CuPc and PTCBI has the properties of current-flow anisotropy and physical instability at high current necessary for the cross-point diode memory application discussed above, in the previous section. Many other chemical compositions for a donor/acceptor-organic-junction sheet that can serve in the cross-point diode memory application according to the present invention are possible. Two-layer organic sheets, with each layer composed of one or more small-molecule organic compounds, are suitable, but multi-layer donor/acceptor-organic-junction sheets with appropriate anisotropic and high-current instability characteristics may be used. For example, many different substituted phthalocyanines, or related organic molecules such as porphyrines, tetrobenzoporphyrines, or tetraazaporphyrines may be employed in place of CuPc, and many appropriately substituted perylene or other large, fused-ring molecules, such as various perylenetetracarboxylic acid amides and perylenetetracarboxylic diimides, may be used in place of PTCBI.

Although the present invention has been described in terms of a particular embodiment, it is not intended that the invention be limited to this embodiment. Modifications within the spirit of the invention will be apparent to those skilled in the art. For example, as discussed above, any single-layer, two-layer, or multi-layer donor/acceptor-organic-junction sheet having the current-carrying anisotropy and high-current physical instability needed for the continuous-sheet memory element application, illustrated in FIGS. 2 and 4–5, falls within the scope of the present invention. Note that the present invention may be employed in the cross-point diode memory devices illustrated in FIG. 1, but may also be employed in write-once memory devices with different internal structures, provided that a continuous donor/acceptor-organic-junction sheet of the present invention is employed for a number of diode-and-fuse memory elements.

The foregoing description, for purposes of explanation, used specific nomenclature to provide a thorough understanding of the invention. However, it will be apparent to one skilled in the art that the specific details are not required in order to practice the invention. In other instances, well-known circuits and devices are shown in block diagram form in order to avoid unnecessary distraction from the underlying invention. Thus, the foregoing descriptions of specific embodiments of the present invention are presented for purposes of illustration and description; they are not intended to be exhaustive or to limit the invention to the precise forms disclosed, obviously many modifications and variations are possible in view of the above teachings. The embodiments were chosen and described in order to best explain the principles of the invention and its practical applications and to thereby enable others skilled in the art to best utilize the invention and various embodiments with various modifications as are suited to the particular use contemplated. It is intended that the scope of the invention be defined by the following claims and their equivalents:

What is claimed is:

1. A continuous diode sheet, used in an electronic memory array, that couples row lines to column lines within the two-dimensional memory array, a volume of the diode sheet between each intersecting row-and-column-line grid point of the electronic memory array serving as a diode-and-fuse memory element, the continuous diode sheet comprising a semiconductor-junction sheet that:

under forward bias has high electrical conductivity in a direction perpendicular to the diode sheet, but low electrical conductivity under reverse bias, and is therefore a diode;

physically degrades within a volume between a row line and column line between which a current greater than a threshold current passes, and therefore acts as a fuse; and resists flow of electrical current in directions parallel to the sheet, so that a volume of the diode sheet between a row-and-column-line grid point of the electronic memory array is relatively electrically isolated from all other volumes of the diode sheet between other row-and-column-line grid points of the electronic memory array.

2. The continuous diode sheet of claim 1 employed within the electronic memory array as a write-once, cross-point diode memory.

3. The continuous diode sheet of claim 1 comprising a first layer composed of a film of copper phthalocyanine joined to a second layer composed of a film of 3,4,9,10-peryleneteracarboxylic-bis-imaidazole.

4. An electronic memory array comprising:

a set of substantially parallel conductive row lines;

a set of substantially parallel conductive column lines; and a diode sheet between the set of conductive row lines and the set of conductive column lines having top and bottom surfaces substantially parallel to the set of conductive row lines and the set of conductive column lines, a local volume of the diode sheet at each intersection point of a row line and a column line constituting a diode-and-fuse memory element.

5. The electronic memory array of claim 4 wherein electrical resistance of the diode sheet is anisotropic, with low electrical resistance in a direction perpendicular to the top and bottom surfaces of the diode sheet and high electrical resistance in a reverse direction and in all directions substantially parallel to the top and bottom surfaces of the diode sheet.

6. The electronic memory array of claim 4 further including externally accessible conductive connectors coupled to the row and column lines.

7. The electronic memory array of claim 4 wherein the diode sheet comprises a first layer composed of a film of copper phthalocyanine joined to a second layer composed of a film of 3,4,9,10-peryleneteracarboxylic-bis-imaidazole.

8. The electronic memory array of claim 4 wherein each diode-and-fuse memory element stores a bit of information.

9. The electronic memory array of claim 8 wherein a blown diode-and-fuse memory element represents a bit "1" and an intact diode-and-fuse memory element represents a bit "0."

10. The electronic memory array of claim 8 wherein a blown diode-and-fuse memory element represents the a "0" and an intact diode-and-fuse memory element represents a bit "1."

11. A method for constructing a two-dimensional memory array, the method comprising:

providing a substrate with a first set of parallel conductive lines;

layering a donor/acceptor-organic-junction sheet on top of the first set of the parallel conductive lines, the donor/acceptor-organic-junction sheet conducting current in one direction perpendicular to the sheet, and therefore acting as a diode, physically unstable within a volume between a row line and column line between which a current greater than a threshold current passes, and resisting the flow of current in directions parallel to the sheet, so that the volumes of the donor/acceptororganicjunction sheet material between a row-and-column-line grid point of the two-dimensional memory array is relatively electrically isolated from all other volumes of the donor/acceptororganicjunction sheet material between other row-and-column-line grid points of the two-dimensional memory array;

placing a second set of parallel conductive lines perpendicular to the first set of parallel conductive lines column lines on top of the donor/acceptororganicjunction sheet; and providing externally accessible conductive connectors coupled to the row and column lines.

12. The method of claim 4 wherein the donor/acceptororganicjunction sheet comprises a first layer composed of a film of copper phthalocyanine joined to a second layer composed of a film of 3,4,9,10-peryleneteracarboxylic-bis-imaidazole.

* * * * *